United States Patent
Giusti et al.

(10) Patent No.: US 10,356,531 B2
(45) Date of Patent: Jul. 16, 2019

(54) PIEZOELECTRIC MEMS SENSOR, SUCH AS FORCE, PRESSURE, DEFORMATION SENSOR OR MICROPHONE, WITH IMPROVED SENSITIVITY

(71) Applicant: STMICROELECTRONICS S.R.L., Agrate Brianza (IT)

(72) Inventors: Domenico Giusti, Monza (IT); Sebastiano Conti, Pregnana Milanese (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/629,518

(22) Filed: Jun. 21, 2017

(65) Prior Publication Data
US 2018/0124521 A1   May 3, 2018

(30) Foreign Application Priority Data
Oct. 31, 2016   (IT) .......................... 102016000109764

(51) Int. Cl.
*H04R 17/02*   (2006.01)
*B81B 3/00*   (2006.01)
(Continued)

(52) U.S. Cl.
CPC ........... *H04R 17/02* (2013.01); *B81B 3/0037* (2013.01); *B81C 1/00158* (2013.01); *G01L 9/0042* (2013.01); *G01L 9/0073* (2013.01); *H01L 41/042* (2013.01); *H01L 41/1132* (2013.01); *H01L 41/1138* (2013.01); *H01L 41/312* (2013.01); *H04R 19/005* (2013.01); *H04R 19/04* (2013.01); *H04R 31/003* (2013.01);
(Continued)

(58) Field of Classification Search
CPC ... H04R 7/02; H04R 7/06; H04R 7/10; H04R 7/14; H04R 7/125; H04R 2201/003; B81C 1/00158; G01L 9/0042; G01L 9/0045; G01L 9/0047; G01L 2009/0069
See application file for complete search history.

(56) References Cited

U.S. PATENT DOCUMENTS

| | | | |
|---|---|---|---|
| 5,539,236 A * | 7/1996 | Kurtz | G01P 15/123 257/415 |
| 6,006,607 A * | 12/1999 | Bryzek | G01L 9/0054 338/42 |

(Continued)

FOREIGN PATENT DOCUMENTS

| | | |
|---|---|---|
| EP | 2204641 A1 | 7/2010 |
| WO | 2007117198 A1 | 10/2007 |
| WO | 2009072704 A1 | 6/2009 |

*Primary Examiner* — Joshua Kaufman
(74) *Attorney, Agent, or Firm* — Seed IP Law Group LLP

(57) ABSTRACT

A MEMS sensor, in particular a microphone, of a piezoelectric type, formed in a membrane of semiconductor material accommodating a compliant portion, which extends from a first surface to a second surface of the membrane. The compliant portion has a Young's modulus lower than the rest of the membrane. A sensitive region having piezoelectric material extends on the first surface, over the compliant portion and is fixed at its ends to the membrane on opposite sides of the compliant portion. A third area of the membrane, arranged between the compliant portion and the second surface, forms a hinge element.

19 Claims, 6 Drawing Sheets

(51) Int. Cl.
  *B81C 1/00*      (2006.01)
  *H01L 41/04*     (2006.01)
  *H01L 41/113*    (2006.01)
  *H01L 41/312*    (2013.01)
  *H04R 31/00*     (2006.01)
  *H04R 19/00*     (2006.01)
  *H04R 19/04*     (2006.01)
  *G01L 9/00*      (2006.01)

(52) U.S. Cl.
  CPC ............... *B81B 2201/0235* (2013.01); *B81B 2201/0257* (2013.01); *B81B 2201/0264* (2013.01); *B81B 2203/0127* (2013.01); *B81B 2203/0315* (2013.01); *B81B 2203/04* (2013.01); *B81B 2207/012* (2013.01); *H04R 2201/003* (2013.01)

(56) References Cited

U.S. PATENT DOCUMENTS

| | | |
|---|---|---|
| 8,261,617 B2 | 9/2012 | Choi et al. |
| 8,448,494 B2 | 5/2013 | Mastromatteo et al. |
| 8,896,184 B2 | 11/2014 | Grosh et al. |
| 2005/0074919 A1* | 4/2005 | Patel ............... B81B 7/0077 438/107 |
| 2010/0090565 A1* | 4/2010 | Bhaskaran ......... B81B 3/0021 310/330 |
| 2014/0053650 A1* | 2/2014 | Hall ................ G01H 5/00 73/645 |

* cited by examiner

PIEZOELECTRIC MEMS SENSOR, SUCH AS FORCE, PRESSURE, DEFORMATION SENSOR OR MICROPHONE, WITH IMPROVED SENSITIVITY

BACKGROUND

Technical Field

The present disclosure relates to a MEMS (Micro-Electro-Mechanical System) sensor of a piezoelectric type, such as a force sensor, a pressure sensor, a deformation sensor or a microphone, with improved sensitivity. Hereinafter, particular reference will be made to a microphone, without losing generality.

Description of the Related Art

As is known, MEMS techniques of micromachining semiconductor devices enable forming microelectromechanical structures within layers of semiconductor material, deposited (for example, a polycrystalline silicon layer) or grown (for example, an epitaxial layer) on sacrificial layers, which are removed via chemical etching.

For example, MEMS microphones (also referred to as electroacoustic transducers) comprise a flexible membrane integrated in or on a die of semiconductor material, as shown in FIG. 1. Here, the microphone 1 comprises a membrane 2 carried by a substrate 3 and suspended over a cavity 4. The membrane 2 is exposed to sound waves ($p_{atm}$) and deflects as a result of the force exerted by them, as represented with dashed lines.

Measurement of the deflection of the membrane may be of different types, for example, of a piezoresistive type, and to this end piezoresistors are integrated in or on the membrane, of a capacitive type, and to this end the membrane is capacitively coupled to another conductive region of the die, and of an electromagnetic type, and to this end a coil is coupled to a magnetic region. In all cases, the variation of the electrical signal resulting from deflection of the membrane is measured. Recently, microphones of a piezoelectric type have also been proposed, wherein piezoelectricity, i.e., the capacity of some materials of generating a voltage when subjected to a deformation, is exploited.

In particular, in microphones of a piezoelectric type, sensitive regions of piezoelectric material, such as AlN (aluminum nitride) and PZT (Lead Zirconate Titanate) are formed on the membrane, in a central position, subject to maximum deformation and thus maximum stress. In presence of sound waves that cause deflection of the membrane and thus of the sensitive regions, these give rise to a voltage variation correlated to the intensity of the detected sound wave. An interface circuit connected to the MEMS microphone amplifies the generated charge and processes the signal generated thereby so as to output an analog or digital signal, which may then be processed by a microcontroller of an associated electronic device. MEMS microphones of a piezoelectric type are described, for example, in U.S. Pat. No. 8,896,184 and represented in FIGS. 2-4.

FIG. 2 shows an embodiment of a MEMS microphone 5 of a cantilever-beam type described in the U.S. patent referenced above. The microphone 5 comprises a silicon substrate 6, having a cavity 7, and two beams 8A, 8B, extending over the cavity. Each beam 8A, 8B is anchored to the substrate 6 on a respective side (right-hand and left-hand side) and is formed by a layer stack, for example including a plurality of piezoelectric layers 10, for example of molybdenum, alternating with a plurality of electrode layers 11 of, for example, aluminum nitride. A dielectric layer 12 electrically insulates the beams 8A, 8B from the substrate 6.

In a different embodiment, also described in the U.S. patent referenced above and shown in FIGS. 3 and 4, the microphone 15 comprises a membrane 16 peripherally fixed to a substrate 17 and suspended over a cavity 18. The membrane 16 is made of AlN, and molybdenum electrodes 19, 20 are formed both on top of and underneath the membrane 16, so as to form two sensitive elements.

These microphones of a piezoelectric type normally work by deflection. This causes the piezoelectric portions located at the center of the membrane to deflect much more that those arranged at the periphery. In practice, just the central portion of the piezoelectric regions works in an efficient way, whereas the peripheral portions are practically not used.

BRIEF SUMMARY

The present disclosure relates to a MEMS (Micro-Electro-Mechanical System) sensor of a piezoelectric type, such as a force sensor, a pressure sensor, a deformation sensor or a microphone.

According to the present disclosure, a piezoelectric MEMS sensor, a sensing method, and a manufacturing process are provided. One or more embodiments provide a sensor of a piezoelectric type that operates in a more efficient way as compared to the previously discussed solutions.

BRIEF DESCRIPTION OF THE SEVERAL VIEWS OF THE DRAWINGS

For a better understanding of the present disclosure preferred embodiments thereof are now described, purely by way of non-limiting example, with reference to the attached drawings, wherein.

DETAILED DESCRIPTION

The present MEMS sensor is based on the principle of converting the transverse force acting thereon into a longitudinal tensile force, applied on the sensitive piezoelectric material region. The force thus converted is applied in a uniform way over the entire or substantially entire volume of the sensitive region, which thus works in a more efficient way.

Figure 1:
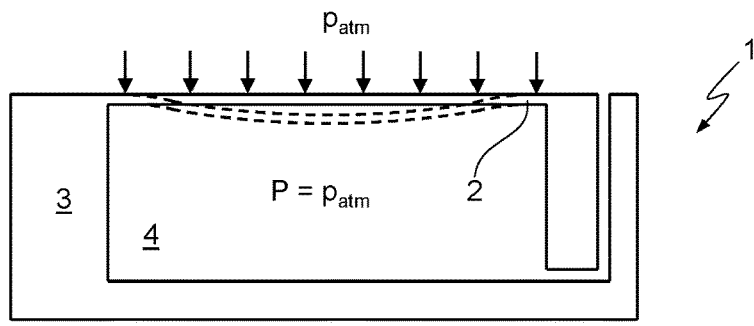
FIG. 1 shows a simplified diagram of a force sensor of a piezoelectric type.
Figure 2:
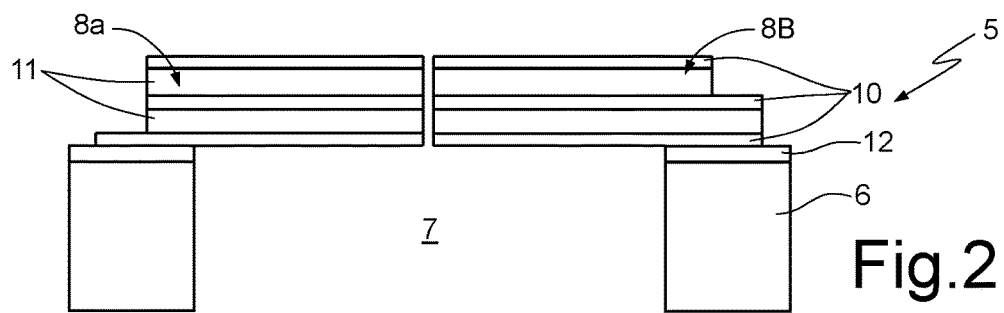
FIG. 2 is a cross-section of a known piezoelectric MEMS microphone.
Figure 3:
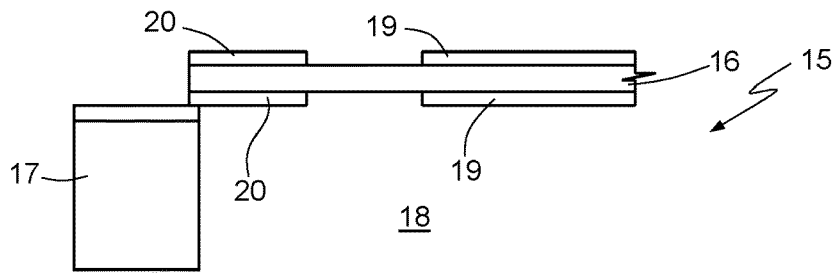
FIG. 3 is a cross-section of a different known piezoelectric MEMS microphone.
Figure 4:
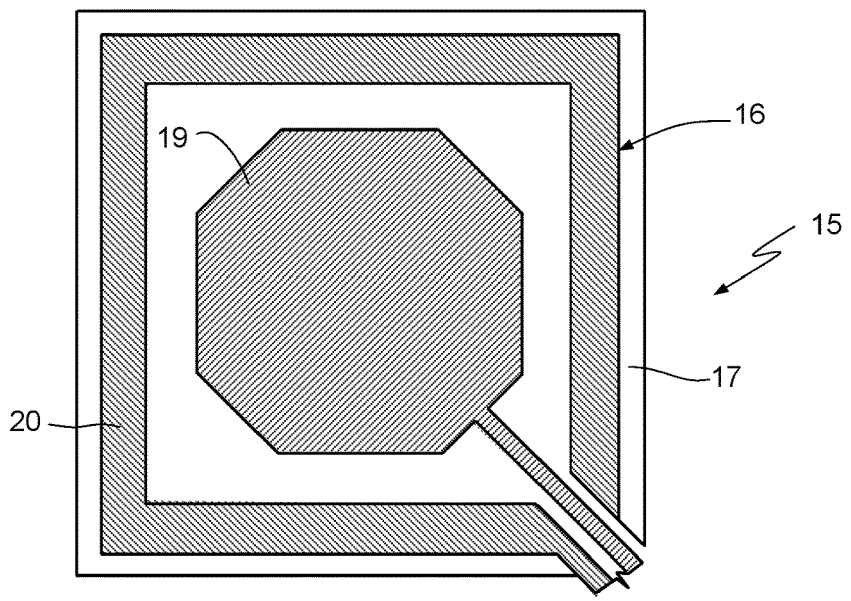
FIG. 4 is a top plan view of the MEMS microphone of FIG. 3.
Figure 5:
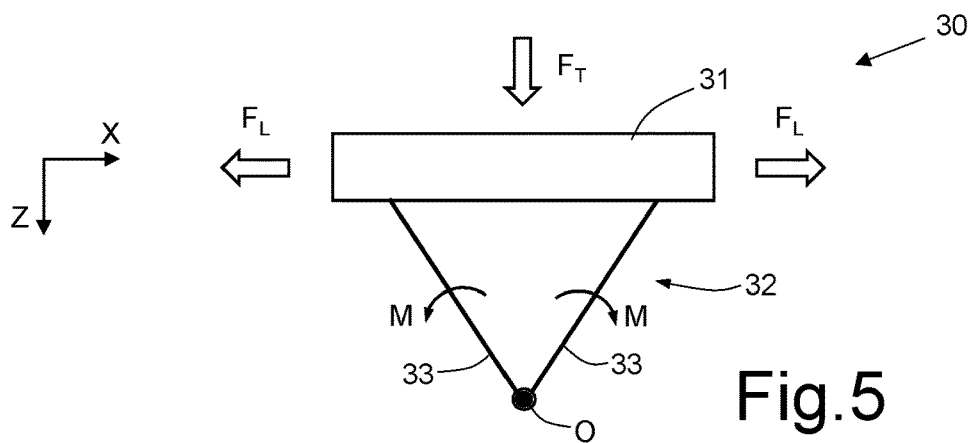
FIG. 5 is a simplified diagram illustrating the working principle of the present sensor.

This may be obtained in the way shown in FIG. 5. Here, a sensor 30 comprises a sensitive region 31 of piezoelectric material, for example PZT, formed above a hinge element 32, here represented by two arms 33 hinged together in O at a first end thereof and fixed to the sensitive region 31 at a second end thereof. The sensitive region 31 is here exemplified as a strip having a longitudinal direction corresponding to the width visible in FIG. 5, parallel to an axis X of a two-dimensional reference system XZ.

As represented in FIG. 5, a transverse force $F_T$ acting on the sensor 30 in a direction perpendicular to the longitudinal direction of the sensitive region 31 (parallel to axis Z) gives rise to a torque M acting on the arms 33 and acting to move the second ends of the arms 33 away from each other. Consequently, the second ends of the arms 33 exert on the sensitive region 31, in the fixing area, a couple of longitudinal forces $F_L$ directed longitudinally with respect to the sensitive region 31, in opposite directions, and "pulling" the sensitive region 31 in the longitudinal direction thereof. In this way, the hinge element 32 converts the transverse force $F_T$ into the longitudinal forces $F_L$ applied in a uniform way over the entire volume of the sensitive region 31. The longitudinal forces $F_L$ is a tensile force applied to the sensitive region 31.

Figure 6:
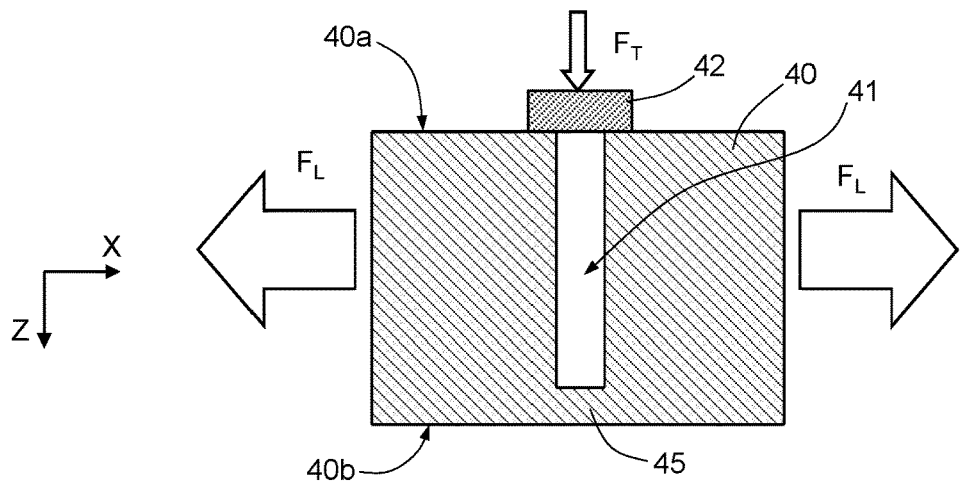
FIG. 6 shows a possible implementation of a MEMS sensor using the working principle represented in FIG. 5.

The principle described above with reference to FIG. 5 may be implemented in a MEMS device of semiconductor material in the way shown in FIG. 6.

Here, a body 40 of semiconductor material, for example silicon, having a first surface 40a and a second surface 40b, opposite to each other, has a compliant region 41 extending from the first surface 40a as far as near the second surface 40b.

The compliant region 41 may be a cavity that is empty or filled with material having a lower coefficient of elasticity than the semiconductor material of the body 40, for example silicon oxide. In particular, in the embodiment in which material fills the cavity, the material in the cavity has a Young's modulus of elasticity that is less than a Young's modulus of elasticity of the semiconductor material of the body 40.

The portion of the body 40 arranged underneath the compliant region 41, between the bottom of the latter and the second surface 40b of the body 40, has a smaller thickness than the rest of the body 40 and a lower compliance as compared to the volume of the cavity 41, and forms a hinge region 45, similar to hinge element 32 of FIG. 5.

A sensitive region 42, of piezoelectric material, extends over the first surface 40a, at the compliant region 41, and is fixed to the body 40 at two opposite ends thereof, on two portions of the body 40 arranged on opposite sides with respect to the compliant region 41.

Consequently, analogously to what has been described for FIG. 5, a transverse force $F_T$, for example a sound wave, acting on the body 40 perpendicularly to the first surface 40a, gives rise to a couple of longitudinal forces $F_L$ directed perpendicular to the first surface 40a and in opposite directions. These longitudinal forces $F_L$ act to move away from each other the two portions of the body 40 arranged on opposite sides of the cavity 41 and thus the ends of the sensitive region 42, causing a tensile deformation of the sensitive region 42. As a result of the piezoelectric effect, a voltage is generated that may be measured.

It should be noted that, by appropriately sizing the cavity 41 and the sensitive region 42, it is possible to prevent downward warping of the sensitive region 42 as a result of longitudinal forces $F_L$, even when the cavity 41 is empty. In this case, for example, the width of the cavity 41 (in a direction parallel to axis X) may be smaller than the thickness of the sensitive region 42 (in a direction parallel to axis Z). In this way, i.e., a performance gain is obtained, since the capacitance of the sensitive region 42 is reduced, and the generated electrical charge and thus the voltage are increased, as discussed hereinafter.

Figure 7:
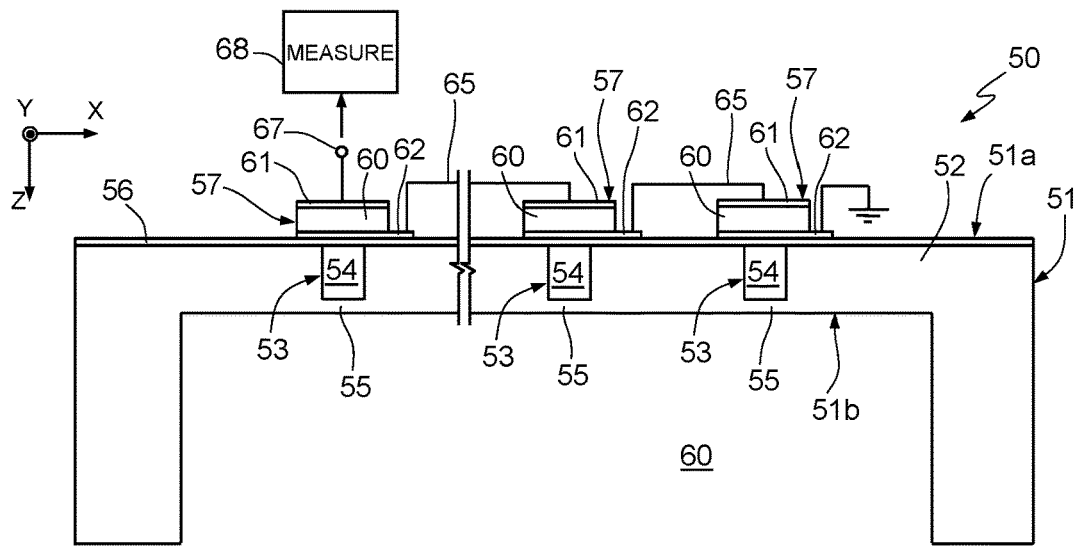
FIG. 7 is a cross-section of a microphone using the working principle represented in FIG. 5.

FIG. 7 shows an embodiment of a MEMS sensor, for example a microphone 50, implementing the principle described above with reference to FIGS. 5 and 6.

In detail, the microphone 50 comprises a body 51 of semiconductor material, for example monocrystalline or polycrystalline silicon. The body 51 has a first surface 51a and a second surface 51b.

The first surface 51a is planar and extends parallel to a plane XY of a Cartesian reference system XYZ. The second surface 51B is not planar due to the presence of a recess 60 on the back. Consequently, the body 50 has a smaller depth (in the direction Z) in a central area (here forming a membrane 52) and a greater depth, in an area external to the membrane 52.

For example, the membrane 52 may have a depth comprised between 2 and 50 μm, for example 3 μm. The rest of the body 51 may have a depth typical of silicon wafers, for example between 400 and 720 μm.

The membrane 52 has a plurality of cavities 53 extending from the first surface 51a as far as near the second surface 51b. The cavities 53 are arranged alongside each other, generally at a uniform distance from each other, and may have a closed shape, for example circular, square, or polygonal, or have an elongated shape, for example rectilinear, or be S- or C-shaped, directed transversely to the drawing plane. The cavities 53 are here filled with silicon oxide 54.

Due to the different elastic characteristics of silicon and silicon oxide (silicon oxide has a Young's modulus $E_{Ox}$=70 GPa and silicon has a Young's modulus $E_{Si}$=160 GPa), the portions of the membrane 52 underneath the cavity 53 form hinge portions 55, similar to the hinge region 45 of FIG. 6. This is also favored by the fact that the hinge portions 55 have in general a smaller depth (in direction Z) than the cavities 53 and thus than the silicon oxide regions 54. For example, the hinge regions 55 may have a depth comprised between 0.2 and 10 μm. On the hypothesis indicated above of the membrane 52 having a depth comprised between 2 and 50 μm, the cavities 53 thus have a depth comprised between 0.8 and 49 μm.

Figure 8:
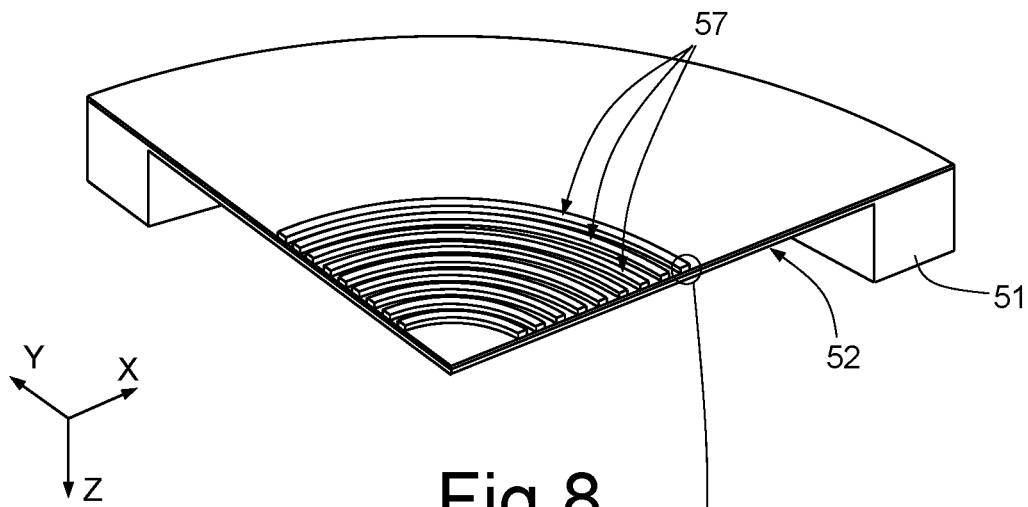
FIG. 8 is a perspective view from above of a portion of the microphone of FIG. 7.
Figure 9:
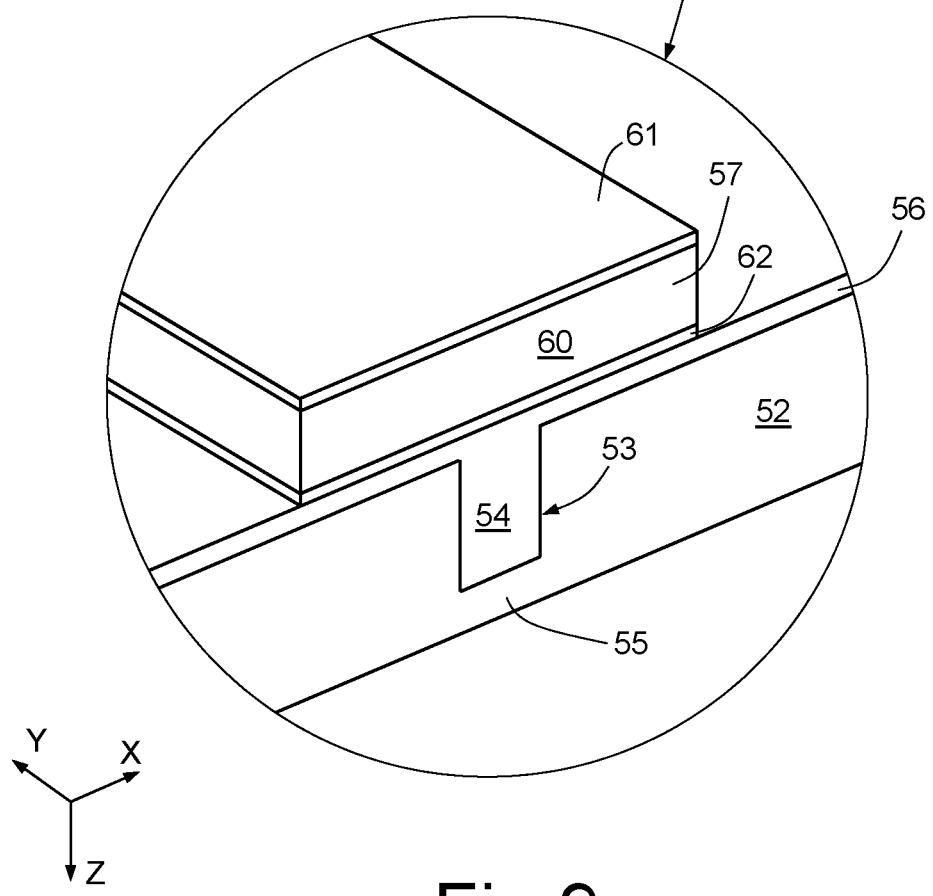
FIG. 9 shows an enlarged detail of the microphone of FIG. 8.

A thin insulating layer 56, for example of silicon oxide of a thickness comprised between 0.1 and 1 μm, extends over the first surface 51a of the body 51, and a plurality of sensitive regions 57 extends over the insulating layer 56. Each sensitive region 57 is arranged in a transverse direction over a respective cavity 53, and has a greater width (in direction X, in the represented cross-section) than the corresponding cavity 53. Consequently, the ends of each sensitive region 57 (in direction X, transverse to the cavity 53) are fixed to the first surface 51a of the body 51 on opposite sides of the respective cavity 53. It should be noted that, if the cavities 53 have a circular or polygonal shape, the sensitive regions 57 may have a corresponding circular or polygonal shape, so as to extend parallel to the cavities 53 in plane XY. For example, FIG. 8 shows in a simplified way the shape of sensitive regions 57 in a membrane 52 of a circular shape (represented only for one quarter), and FIG. 9 shows an enlarged detail of FIG. 8. In this case, the cavities 53 and the sensitive regions 57 are shaped as concentric rings, at a uniform distance from each other.

In an embodiment, the cavities 53 may have a width (in direction X of FIGS. 7-9) of approximately 2 µm, and the sensitive regions 57 may have a width comprised between 3 and 10 µm, for example 4 µm.

The sensitive regions 57 are formed by a stack including a bottom electrode 62, a piezoelectric material region 60, for example of PZT (Pb, Zr, TiO$_3$), AlN, ZnO, and the like, and a top electrode 61. In detail, each bottom electrode 62 extends directly over the insulating layer 56 and has a larger area than the piezoelectric material region 60, here a greater length in direction X. Each top electrode 61 extends on a respective piezoelectric material region 60 and is electrically connected, via conductive lines 65 represented only schematically, to the bottom electrode 62 of one of the two adjacent sensitive regions 57, here the sensitive region 57 arranged at the right, so as to form a series connection. The top electrode 62 of the first sensitive region 57 of the series, here the sensitive region 57 arranged furthest to the left, is connected to a terminal 67, which is in turn coupled to a measurement element or device 68, shown only schematically, external to or integrated in the body 51. The bottom electrode 61 of the last sensitive region 57 of the series, here the sensitive region 57 arranged furthest to the right, is grounded.

In this way, in presence of an external force acting perpendicular to the first surface 51a of the body 51, for example a sound wave, on the terminal 67 a voltage is generated which is the sum of the voltages generated on all sensitive regions 57 connected in series, as a result of the stress acting thereon.

An example of the process for manufacturing the MEMS microphone 50 of FIG. 7 is shown in FIGS. 10-15 and described hereinafter.

Figure 10:
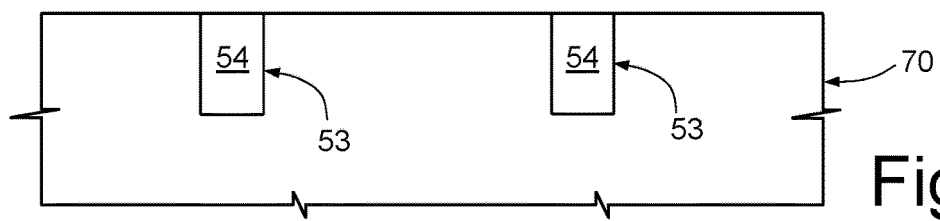
FIGS. 10-15 are cross-sections of a silicon wafer in successive manufacturing steps of the microphone of FIG. 7.

In detail, initially, FIG. 10, the cavities 53 are formed in a silicon wafer 70, by chemical etching, in a known way, until the desired depth (comprised, for example, between 1 and 49 µm, as indicated above) is reached. The cavities 53 are filled with insulating material, for example by depositing oxide or thermal growth and subsequent planarization, such as chemical-mechanical polishing (CMP).

Figure 11:
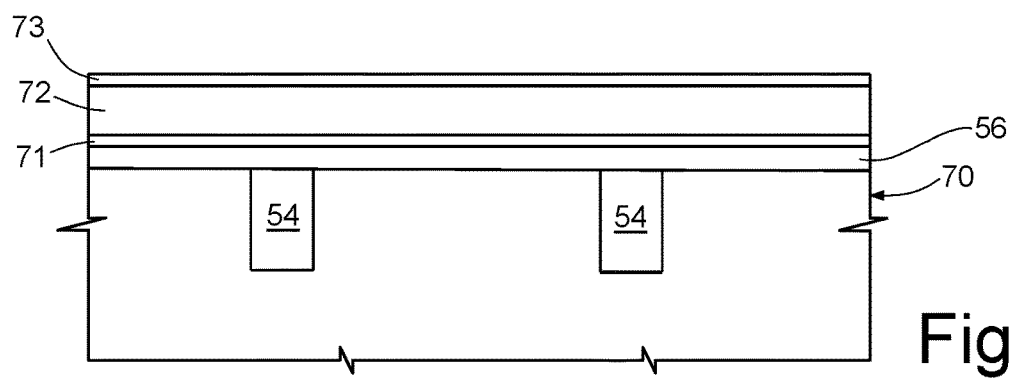

As shown in FIG. 11, the insulating layer 56 is deposited or grown and in sequence a first conductive material layer 71, for example titanium (Ti) or platinum (Pt), with a thickness comprised between approximately 20 and 100 nm; a piezoelectric material layer 72, for example PZT (Pb, Zr, TiO$_3$), with a thickness comprised between 1.5 and 2.5 µm, in particular 2 µm; and a second conductive material layer 73, for example ruthenium, with a thickness comprised between approximately 20 and 100 nm, are deposited.

Figure 12:
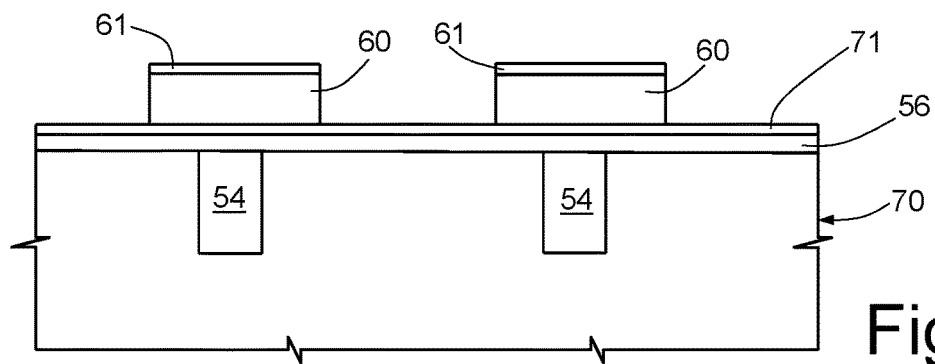

As shown in FIG. 12, using a resist mask (not shown), the second conductive material layer 73 and the piezoelectric material layer 72 are etched and selectively removed so as to form the top electrodes 61 and the piezoelectric material regions 60.

Figure 13:
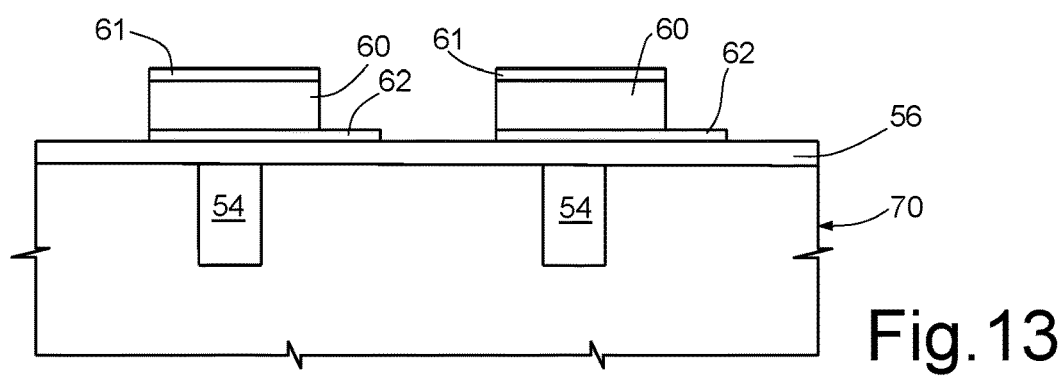

As shown in FIG. 13, using a resist mask (not shown), the first conductive material layer 71 is selectively etched and removed so as to form the bottom electrodes 62.

Figure 14:
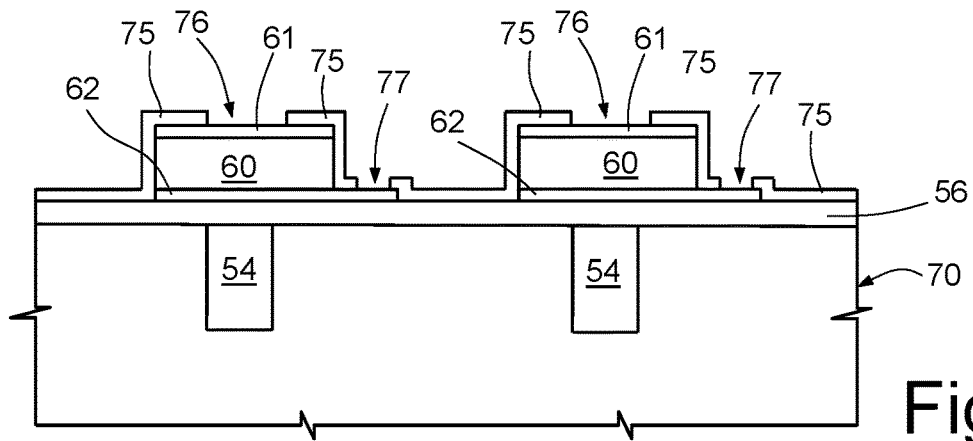

As shown in FIG. 14, a passivation layer 75 is deposited and defined. The passivation layer 75 may be made, for example, silicon oxide SiO$_2$ deposited with PECVD technique, with a thickness comprised between approximately 15 and 495 nm, for example approximately 300 nm. The passivation layer 75 is selectively removed at a central portion of the top electrode 61, to form openings 76, and at the projecting portion of the bottom electrodes 62, to form openings 77.

Figure 15:
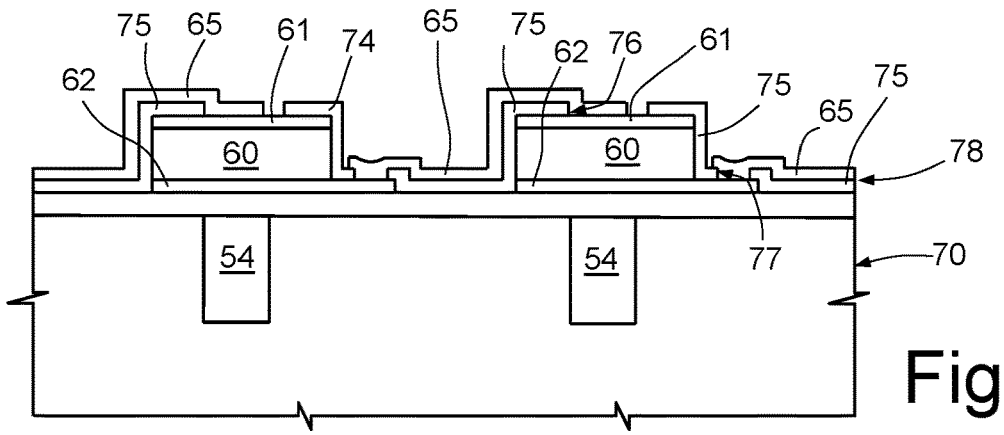

As shown in FIG. 15, a connection layer 78 of conductive material, for example metal, in particular titanium or gold, is deposited and defined, with a thickness comprised between approximately 20 and 500 nm, for example approximately 400 nm. After definition, the connection layer 78 forms the conductive lines 65, each having a first end in direct contact with a respective top electrode 61, at an opening 76, and a second end in direct contact with an adjacent bottom electrode 62, at an opening 77.

The wafer 70 is etched from the back so as to form recesses 60 and is diced to form a plurality of devices 50, as shown in FIG. 7.

The sensor described herein and the corresponding manufacturing process have numerous advantages.

First, the sensor enables application of the force to be measured in a uniform way and over the entire volume of the sensitive region 57 of piezoelectric material, thus enabling an improved detection efficiency.

The possibility of forming various series-connected sensitive regions 57 makes provides an excellent detection sensitivity.

The sensor may be obtained using common steps and machines for manufacturing MEMS, and thus in a low-cost and reliable way.

The size of the individual sensitive regions may be adapted to the sensing requirements. For example, by forming sensitive regions of a very small area it is possible to detect even small deformations (and thus small forces or pressures and sounds of low intensity), since they are capacitive elements and need low electrical charges to charge.

Figure 16:
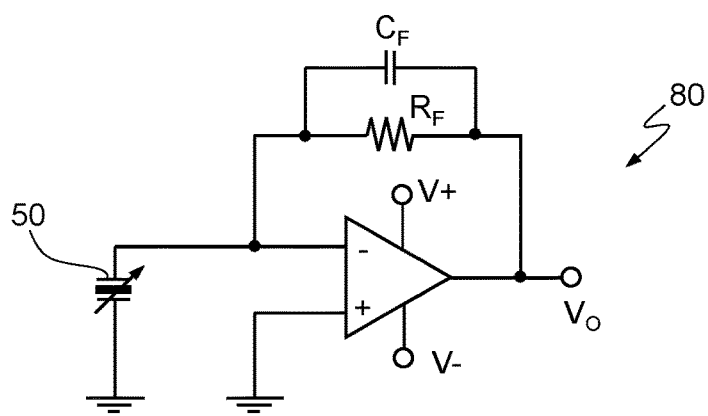
FIG. 16 shows a simplified circuit diagram of a pre-amplifier connected to the microphone of FIG. 7.

The microphone 50 of FIG. 7 may be connected to a read pre-amplifier as shown in FIG. 16. Here the read pre-amplifier, designated as a whole by 80, is basically formed by a charge amplifier having an inverting input connected to the microphone 50. With the configuration shown, the output voltage $V_O$ of the read pre-amplifier 80 is proportional to the charge variation $\Delta Q$ of the microphone 50

$$V_O = -\Delta Q/C_F$$

Figure 17:
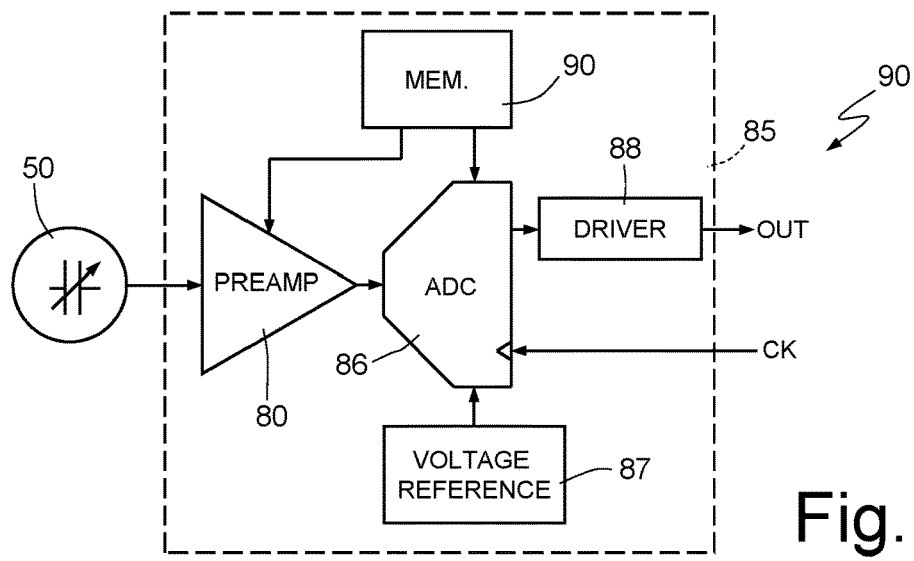
FIG. 17 shows a block diagram of an acoustic transducer comprising the microphone of FIG. 7 and the pre-amplifier of FIG. 17.

The read pre-amplifier 80 outputs an analog signal, that may be directly used or may form part of an interface circuit 85 with digital output, as shown for example in FIG. 17. Here, the interface circuit, designated by 85 and made, for example, as an ASIC (Application-Specific Integrated Circuit), comprises the read pre-amplifier 80; an analog-to-digital converter 86, for example of the Sigma-Delta type, configured to receive a clock signal CK and the signal amplified by the read pre-amplifier 80; a reference-signal generator circuit 87; and a driver 88, designed to function as an interface between the analog-to-digital converter 86 and an external system, for example, a microcontroller of an associated electronic device.

Further, the interface circuit 85 may comprise a (volatile or non-volatile) memory 90, for example programmable from outside. The microphone 50 and the interface circuit 85 together form an acoustic transducer 90.

Advantageously, two distinct chips integrate the microphone 50 and the interface circuit 85; they may be housed in a single package, with an appropriate arrangement (for example, stacked or arranged side-by-side).

Figure 18:
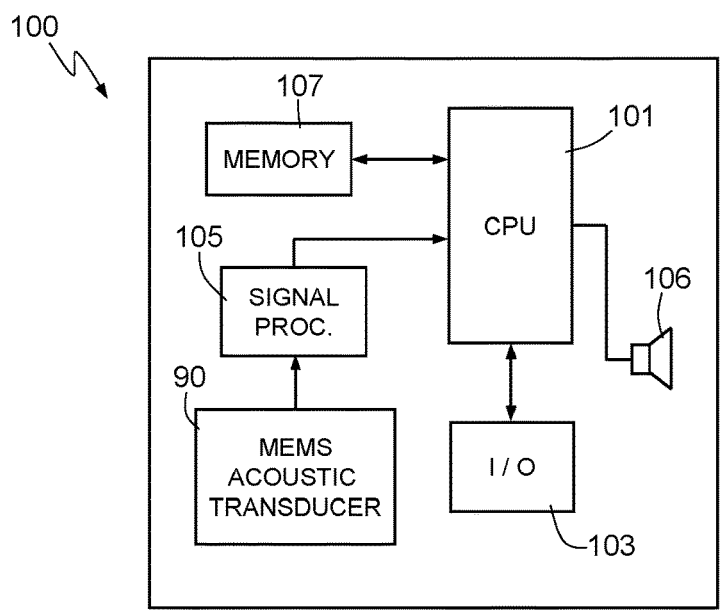
FIG. 18 shows a simplified block diagram of an electronic apparatus provided with the present microphone.

The microphone 50, the read pre-amplifier 80, and/or the interface circuit 85 may be used in an electronic device 100, as shown in FIG. 18.

The electronic device 100 is, for example, a portable mobile-communication device, such as a cellphone, a PDA, a notebook, but also a voice recorder, a reader of audio files with voice-recording capacity, etc. Alternatively, the electronic device 100 may be an acoustic apparatus, such as a headphone system, a hydrophone, that is able to work under water, or any wearable device, including a smartwatch or a hearing-aid device.

The electronic device 100 of FIG. 18 comprises a microprocessor 101 and an input/output unit 103, for example having a keypad and a display, connected to the microprocessor 101. The acoustic transducer 90 communicates with the microprocessor 101 via a signal-processing block 105 (which may carry out further processing operations on the analog or digital output signal of the acoustic transducer 90). Further, the electronic device 100 may comprises a speaker 106, for generating sounds on an audio output (not shown), and an internal memory 107.

Finally, it is clear that modifications and variations may be made to the MEMS sensor and to the corresponding manufacturing process described and illustrated herein, without thereby departing from the scope of the present disclosure.

For example, the MEMS sensor may be used for detecting loads and/or deformations of a different type.

The region 60 may be of a material chosen as desired from materials having piezoelectric properties.

The cavity or cavities 53 may be empty, as described. In this case, supporting structures (bridges) may be provided above the surface of the body 51, to support the sensitive regions 57, if necessary.

The compliant portion 54 may be made of a material different from silicon oxide, for example a different semiconductor material or an insulating material (for instance, a polymer such as an epoxy resin); alternatively, it may also be made of silicon processed in a particular way, such as porous silicon, having a Young's modulus much lower than that of monocrystalline/polycrystalline silicon.

If the manufacturing process so allows, the recess 60 on the back of the membrane 52 may be made before formation of the sensitive regions 57. Alternatively, instead of providing a recess 60, the silicon wafer 70 may be thinned out in a uniform way to the desired thickness.

Figure 19:
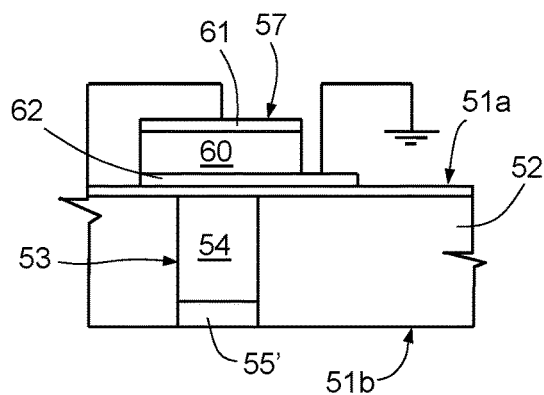
FIG. 19 shows a detail of a different embodiment of the microphone of FIG. 7.

Further, the hinge portion 55 may be made of a material different from that of the rest of the membrane 52, for example of TiW, which has a very high Young's modulus. In this case, as an alternative to what shown in FIG. 10, after forming the cavities 53 (which may have a greater depth than represented in FIGS. 7-15), these are initially filled in the bottom portion with TiW or other material with high Young's modulus (thus forming a hinge region 55') and then completely filled with the material of the compliant regions 54. After the sensitive regions 57 and the conductive lines 65 have been formed, back etching is here carried out until reaching the hinge region 55', as shown in the enlarged detail of FIG. 19.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A piezoelectric MEMS sensor, comprising:
   a membrane of semiconductor material having a first surface and a second surface;
   a compliant portion within the membrane extending from the first surface toward the second surface, the compliant portion having a closed shape at the first surface, the closed shape of the compliant portion separating a first area of the membrane from a second area of the membrane and forming a third area that is between the compliant portion and the second surface, the third area forming a hinge element, the first and second areas arranged on different sides of the compliant portion, the compliant portion having a Young's modulus of elasticity that is lower than a Young's modulus of elasticity of the semiconductor material; and
   a sensitive region comprising a piezoelectric material on the first surface of the compliant portion and covering the compliant portion, the sensitive region having the closed shape, the sensitive region having a first portion fixed to the first area of the membrane and a second portion fixed to the second area of the membrane.

2. The MEMS sensor according to claim 1, wherein the compliant portion is a cavity in the membrane.

3. The MEMS sensor according to claim 2, wherein the cavity is filled with a material having a Young's modulus of elasticity that is lower than the Young's modulus of elasticity of semiconductor material.

4. The MEMS sensor according to claim 3, wherein the material that fills the cavity is chosen from a dielectric material, a semiconductor material different from the semiconductor material of the membrane, and porous semiconductor material.

5. The MEMS sensor according to claim 1, wherein the compliant portion is one of a plurality of compliant portions arranged adjacent to each other in the membrane, wherein the sensitive region is one of a plurality of sensitive regions extending on the first surface over a respective compliant portion, the plurality of sensitive regions being fixed to the membrane on opposite sides of the respective compliant portions.

6. The MEMS sensor according to claim 5, wherein plurality of sensitive regions are coupled together in series.

7. The MEMS sensor according to claim 5, wherein:
   each sensitive region of the plurality of sensitive regions comprises a stack of layers including a first electrode, a piezoelectric material region, and a second electrode, and
   the first electrodes of the plurality of sensitive regions is coupled to the second electrodes of an adjacent sensitive region of the plurality of sensitive regions.

8. The MEMS sensor according to claim 5, wherein the plurality of compliant portions and the plurality of sensitive regions extend along concentric circles.

9. The MEMS sensor according to claim 1, forming a sensor selected in the group comprising a pressure sensor, a force sensor, a microphone, a load sensor, and a deformation sensors.

10. The MEMS sensor according to claim 1, wherein the hinge element is of a material different from the material of the first and second areas of the membrane and having a greater Young's modulus of elasticity than the Young's modulus of elasticity of the compliant region.

11. An electronic device, comprising:
    a microprocessor control unit; and an acoustic transducer coupled to the microprocessor control unit, the acoustic transducer comprising:
  a membrane of semiconductor material having a first surface and a second surface;
  a cavity extending from the first surface of the membrane toward the second surface, wherein a portion of the membrane forms a hinge between a bottom surface of the cavity and the second surface of the membrane; and
  a sensitive region on the first surface and covering the cavity, the sensitive region having a first portion fixed to the membrane at a first side of the cavity and a second portion fixed to the membrane at a second side of the cavity, the sensitive region being concentric with the compliant portion.

12. The electronic device according to claim 11 wherein the acoustic transducer includes a material filling the cavity, wherein the material in the cavity has a Young's modulus of elasticity that is lower than a Young's modulus of elasticity of the semiconductor material.

13. The electronic device according to claim 12 wherein the material filling the cavity is one of an oxide, an epoxy resin, a semiconductor material different from the semiconductor material of the membrane, and a porous semiconductor material.

14. The electronic device according to claim 11 wherein the cavity of the acoustic transducer is one of a plurality of cavities, each of the plurality of cavities forming hinges between bottom surfaces of the cavities and the second surface of the membrane, wherein the sensitive region is one of a plurality of sensitive regions, each of the plurality of sensitive regions being on the first surface of the membrane and covering a respective cavity.

15. A method comprising:
  detecting forces or deformations according to a piezoelectric principle, wherein detecting comprises detecting forces acting transversely to a MEMS sensor including:
    a membrane of semiconductor material having a first surface and a second surface;
    a compliant portion within the membrane, the compliant portion extending from the first surface towards the second surface of the membrane, the compliant portion having a closed shape at the first surface separating a first area from a second area of the membrane, the first and second areas arranged on different sides of the closed shape at the first surface of the compliant portion, the compliant portion having a Young's modulus of elasticity that is lower than a Young's modulus of elasticity of the first and second areas of the membrane; and
    a sensitive region comprising piezoelectric material, the sensitive region extending on the first surface and over the compliant portion, the sensitive region having the closed shape of the compliant portion, the sensitive region having at least one first portion fixed to the first area of the membrane and one second portion fixed to the second area of the membrane, a third area of the membrane arranged between the compliant portion and the second surface and forming a hinge element, wherein the forces act in a direction transverse to the first surface, wherein detecting comprises:
  converting the forces acting in the direction transverse to the first surface into tensile forces acting, respectively, on the first and second portions of the sensitive region in opposite directions; and
  measuring, on the sensitive region, an electrical quantity variable with the transverse forces.

16. The method according to claim 15 wherein the compliant portion is a cavity that is filled with a material having Young's modulus of elasticity that is lower than a Young's modulus of elasticity of the first and second areas of the membrane.

17. A process for manufacturing a MEMS sensor comprising:
  forming a cavity in a membrane of semiconductor material at a first surface of the membrane toward a second surface of the membrane, wherein forming the cavity forms a hinge element in the membrane between the cavity and the second surface, wherein the cavity has a closed shape at the first surface; and
  coupling a sensitive region comprising piezoelectric material to the first surface over the cavity, wherein coupling includes coupling a first portion to a first portion of the membrane to a first side of the cavity and a second portion to a second portion of the membrane that is on a second side of the cavity, the sensitive region having the closed shape of the cavity.

18. The process according to claim 17, wherein prior to coupling the sensitive region to the first surface, the process comprises filling the cavity with a material, wherein the material has a Young's modulus of elasticity that is lower than a Young's modulus of elasticity of the semiconductor material.

19. The process according to claim 17 comprising forming the cavity in the membrane by removing semiconductor material from a first side of a wafer to expose the second surface and form the membrane.

* * * * *